United States Patent
Lewis (10) Patent No.: US 6,917,074 B1
(45) Date of Patent: Jul. 12, 2005

(54) MULTIPLEXER STRUCTURE WITH INTERDIGITATED GATES AND SHARED DIFFUSION

(75) Inventor: David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/626,264

(22) Filed: Jul. 23, 2003

(51) Int. Cl.⁷ .............................................. H01L 29/76
(52) U.S. Cl. ..................... 257/331; 257/350; 438/152; 438/153; 438/154; 438/155; 438/156
(58) Field of Search ................................ 257/331, 350; 438/152–156

(56) References Cited

U.S. PATENT DOCUMENTS

| | | | |
|---|---|---|---|
| 5,744,995 A | 4/1998 | Young | |
| 5,789,791 A | 8/1998 | Bergemont | |
| 5,831,316 A | 11/1998 | Yu et al. | |
| 6,020,776 A | 2/2000 | Young | |
| 6,140,682 A | * 10/2000 | Liu et al. | |
| 6,197,671 B1 | 3/2001 | Bergemont | |
| 6,809,386 B2 | * 10/2004 | Chaine et al. | ............... 257/368 |

OTHER PUBLICATIONS

Cetiner, B.A. (2002) "Global Modeling Approach for Pre-Matched Multifinger FET," *Microwave and optical tech. letters*, (32):174–178.

Martin, Ken (2000). "Digital Integrated Circuit Design" Chapter 2 In *Processing, Layout, and Related Issues*. Oxford University Press, pp. 48–57.

Rabaey, Jan M. et al. (2003). "Digital Integrated Circuits: A Design Perspective" Chapter 9 In *Coping with Interconnect*. C.G. Sodini ed., Prentice–Hall of India, pp. 456–457.

Weste, Neil H. E. et al., (1994). "Principle of CMOS VLSI Design: A System Perspective" Chapter 4 In *Circuit Characterization and Performance Estimation*. P. S. Gordon ed., Addison Wesley Longman, pp. 186–188, 277–278.

* cited by examiner

*Primary Examiner*—Fetsum Abraham
(74) *Attorney, Agent, or Firm*—Morrison & Foerster LLP (57) ABSTRACT

A multiplexer structure includes a semiconductor substrate having a shared diffusion region. A first gate having a first finger and a second finger is disposed on the shared diffusion region, and a second gate having a first finger and a second finger is disposed on the shared diffusion region. A contact for a first input node is disposed on the shared diffusion region between the first and second fingers of the first gate, and a contact for a second input node is disposed on the shared diffusion region between the first and second fingers of the second gate. A contact for a collector node is disposed on the shared diffusion region between the first and second gates. In operation, closing the first gate electrically connects the first input node and the collector node, and closing the second gate electrically connects the second input node and the collector node.

38 Claims, 5 Drawing Sheets

MULTIPLEXER STRUCTURE WITH INTERDIGITATED GATES AND SHARED DIFFUSION

BACKGROUND OF THE INVENTION

1. Field of Invention

The present invention relates to multiplexer structures for use with programmable logic devices or other similar devices.

2. Description of Related Art

Programmable logic devices (PLDs) (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits (ASICs) have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically contain a large number of multiplexers to select signals from various routing and logic elements, with the input being selected controlled by a number of configuration RAM (C-RAM) bits. Each such multiplexer consists of a number of stages, typically two, where each stage includes a network of pass transistors followed by one or more buffers. Most of the delay and area of a PLD typically relates to the corresponding multiplexers, and so their speed and area are often critically important. Another important factor in constructing such multiplexers is the ability to make electrical connections to the input of a multiplexer independently of the connections to any other multiplexer on the PLD. Although there are some places in the PLD where it may be desirable to have two multiplexers share a common set of inputs, in other areas (such as general routing between logic elements on the PLD) it is preferable that the inputs to each multiplexer be chosen independently.

Conventional multiplexer designs are often limited by inefficient layouts. In some designs, for example, multiple diffusion regions are laid out to form transistor sources and drains, but gaps between them are provided so that the sources and drains are electrically isolated, thereby wasting area and causing increased parasitic capacitance that leads to system delays. In general for MOS transistors, the diffusion area and diffusion perimeter each contribute capacitance to the source and drain nodes. If the transistors in a multiplexer are constructed completely independently, then each transistor will have a full diffusion capacitance connected to each of the source and drain.

According to one alternative approach involving a pair of multiplexers, transistors are laid out using a continuous strip of diffusion, and alternate transistors share source/drain diffusions thereby reducing capacitance. In this approach, however, each input signal goes to both of the multiplexers thereby limiting the effectiveness of the design by restricting the ability to independently choose the connectivity of inputs to multiplexers. (U.S. Pat. No. 6,020,776)

Another concern particular to PLDs is the pitch of the transistors, that is, the spacing between the gates of adjacent transistors. Because the gates of the pass transistors are connected to the C-RAM cells and there are a number of pass transistors laid out in close proximity, it is desirable that the pitch of the pass transistors be similar to the width (or height) of the C-RAMs. C-RAMs are conventionally several times wider than the pitch of minimum spaced gates of transistors. Sharing diffusions reduces the pitch of the gates and if the resulting pitch of transistors per C-RAM is small, it may be necessary to use extra wiring to connect the C-RAMs to the pass transistors, or there may be wasted space if the transistors are constrained to line up with the C-RAM. This type of awkward layout also can lead to an inefficient use of available area.

Thus, there is a need for multiplexer structures that include shared diffusion regions for sources and drains of transistors while avoiding restrictions associated with constrained inputs and awkward layouts.

SUMMARY OF THE INVENTION

In one embodiment of the present invention, a multiplexer structure includes a semiconductor substrate having a shared diffusion region. A first gate having a first finger and a second finger is disposed on the shared diffusion region, and a second gate having a first finger and a second finger is disposed on the shared diffusion region. A contact for a first input node is disposed on the shared diffusion region between the first and second fingers of the first gate, and a contact for a second input node is disposed on the shared diffusion region between the first and second fingers of the second gate. A contact for a collector node is disposed on the shared diffusion region between the first and second gates. In operation, closing the first gate electrically connects the first input node and the collector node, and closing the second gate electrically connects the second input node and the collector node.

Using multiple gate fingers (i.e., interdigitated gates) allows the source and drains from multiple transistors to share the same diffusion area on the integrated circuit. In this way, the present invention enables multiplexer structures with a more effective layout design.

DETAILED DESCRIPTION OF EXEMPLARY EMBODIMENTS

Figure 1:
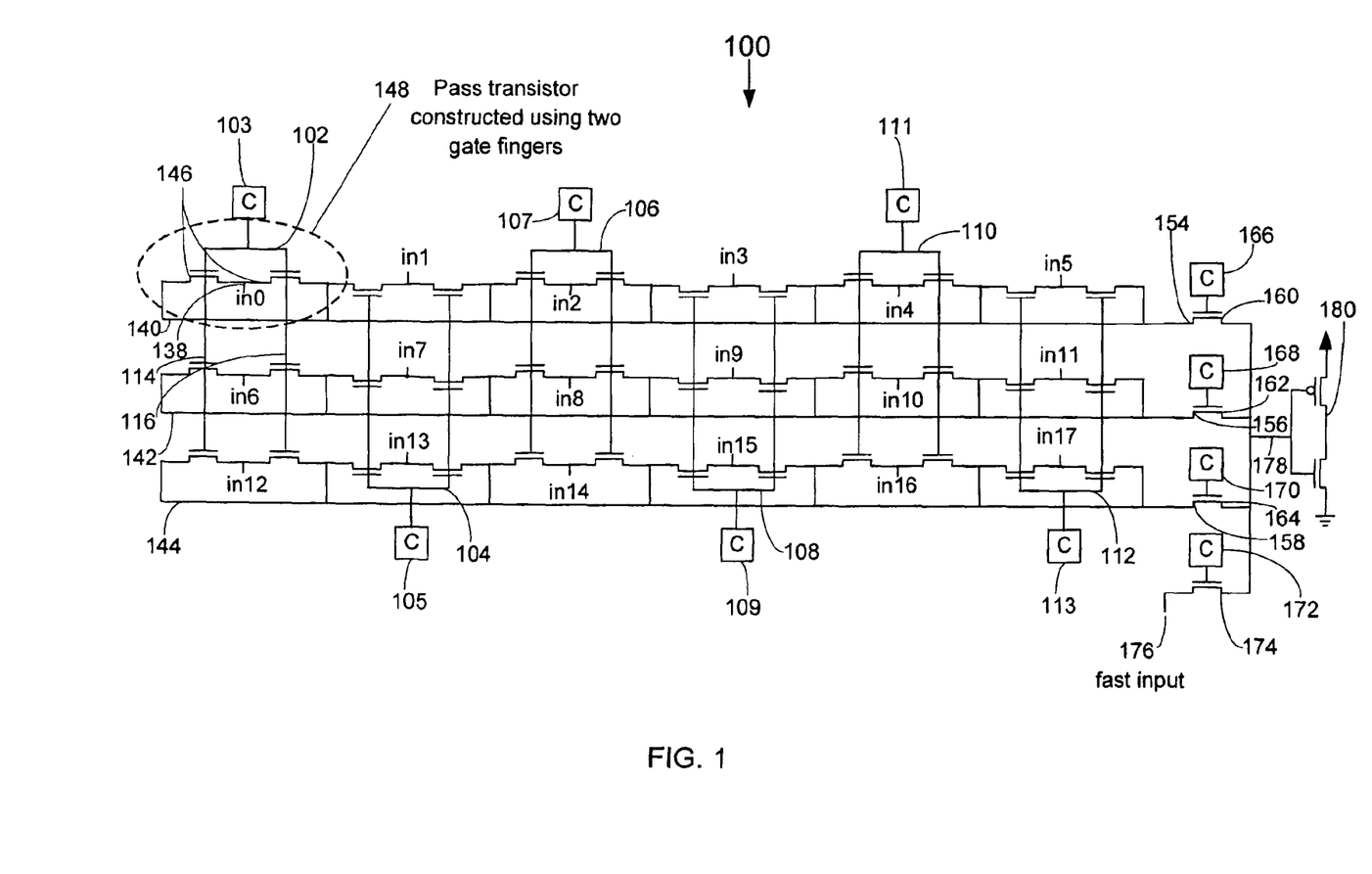
FIG. 1 shows a schematic layout of an 18-to-1 multiplexer according to an embodiment of the present invention.

FIG. 1 shows a schematic layout of an 18-to-1 multiplexer structure 100 according to an embodiment of the present invention. Six gates 102, 104, 106, 108, 110, 112 are shown with an interdigitated structure. For example, the first gate 102 has a first finger 114 and a second finger 116, and the other gates 104, 106, 108, 110, 112, similarly have first fingers and second fingers.

The gates 102, 104, 106, 108, 110, 112 are controlled (i.e., closed or opened) by configuration random-access memory (C-RAM) elements 103, 105, 107, 109, 111, 113 or other logic signals. Inputs nodes 138 provide input values in0–in17 as shown. Collector nodes 140, 142, 144 provide common collectors across rows of the formed transistors so that inputs in0, in1, in2, in3, in4, and in5 are connected by transistors to the first collector node 140. Similarly inputs in6, in7, in8, in9, in10, and in11 are connected to the second collector node 142, and inputs in12, in13, in 14, in15, in 16, and in17 are connected to the third collector node 144. Transistor elements (or sub-elements) 146 are also shown by the conventional symbols between source and drain.

Then for example, a first pass transistor 148 uses two gate fingers 114, 116 and provides a connection gate between a first input node 138 with input in0 and the output at the first collector node 140. Pass transistors are similarly defined for other input/output combinations in FIG. 1.

Outputs 154, 156, 158 from the three collector nodes 140, 142, 144 provide a first multiplexer output stage as input to three transistors 160, 162, 164 that controlled by additional C-RAM elements 166, 168, 170. For convenience, an additional transistor 172 and C-RAM element 174 is used to include an additional fast input 176. The output 178 from these transistors 160, 162, 164, 172 provides a second multiplexer output. A buffer and optional level restorer 180, which is connected to the output 178, is also included in the multiplexer structure 100.

The 18-to-1 multiplexer structure 100 includes a first stage with three 6-to-1 outputs (e.g., inputs in0, in1, in2, in3, in4, and in5 connected to the first output 154). A second stage includes a 3-to-1 multiplexer, which is illustrated with a fourth input 176. This structure 100 desirably enables diffusion sharing in its implementation. Each collector node 140, 142, 144 can be implemented as a set of shared diffusion regions, and the interdigitated structure of the gates 102, 104, 106, 108, 110, 112 enables shared diffusion regions for transistors connected by one of the collector nodes 140, 142, 144.

Figure 2:
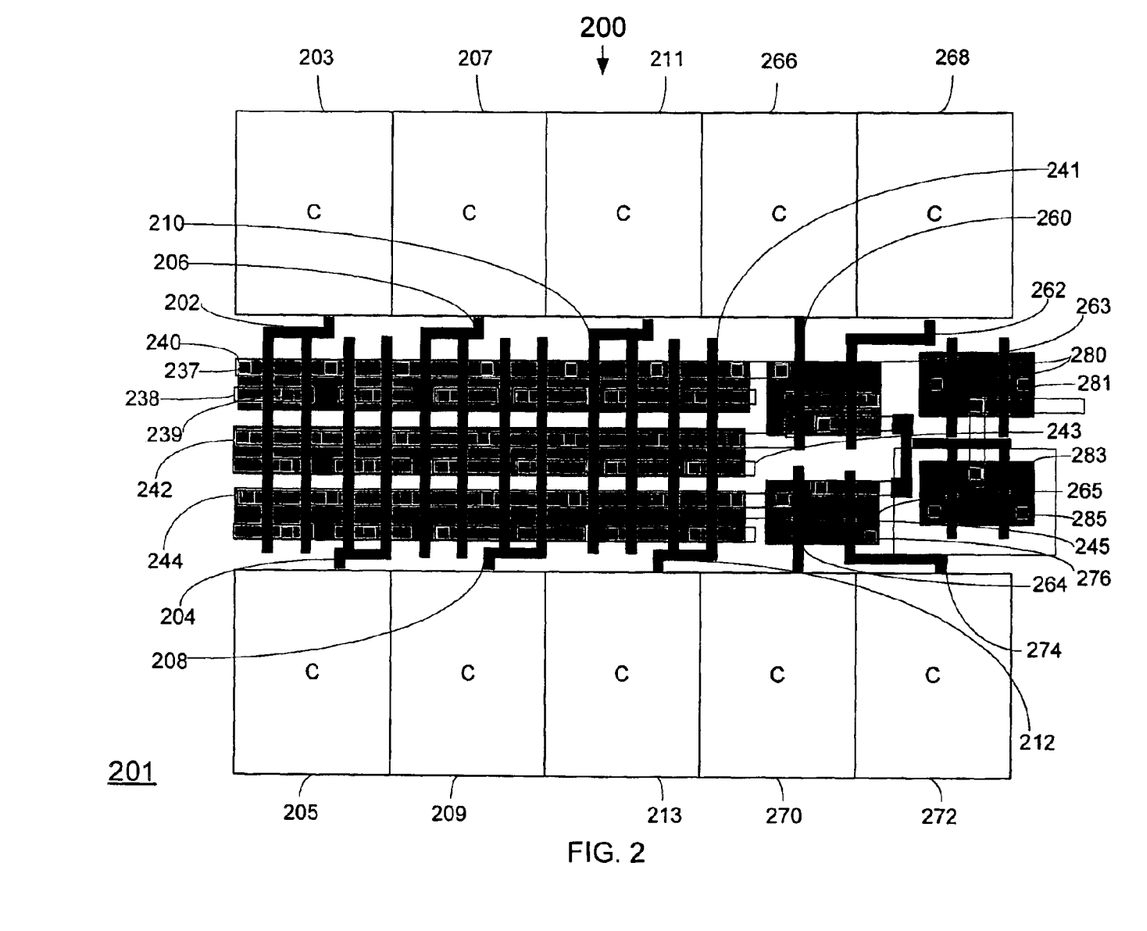
FIG. 2 shows an embodiment of hardware layout applicable to the embodiment shown in FIG. 1.

FIG. 2 shows a hardware layout corresponding to the schematic of FIG. 1. An 18-to-1 multiplexer structure 200 is disposed on a substrate 201. Similarly as in FIG. 1, a first-stage multiplexer structure includes gates 202, 204, 206, 208, 210, 212 with an interdigitated structure and six C-RAM memory elements 203, 205, 207, 209, 211, 213 for controlling the gates. Input nodes 238 are shown with input node contacts 239. Collector nodes 240, 242, 244 are shown with collector node contacts 237. Corresponding to each collector node 240, 242, 244, shared diffusion regions 241, 243, 245 in the substrate 201 encompass collector nodes and associated input nodes.

Similarly as in FIG. 1, a second-stage multiplexer structure includes three C-RAM elements 266, 268, 270 and associated transistor gate elements 260, 262, 264 together with an additional C-RAM element 272 and associated gate element 274 for including a fast input 274. Associated diffusion regions 263, 265 are shown.

Additionally as in FIG. 1, hardware elements 280 and corresponding diffusion regions 281, 283 and contacts 285 are shown in correspondence to the buffer and optional level restorer 180.

As shown in FIG. 2, the interdigitated structure of the gates 202, 204, 206, 208, 210, 212 enables shared diffusion regions 241, 243, 245 for transistors corresponding to each collector node 240, 242, 244 in the first stage structure of the multiplexer 200. Each transistor 148 is constructed as an interdigitated gate with two fingers. The source diffusion (or source node) of each transistor is located between two gate fingers at a contact of a corresponding input node. The drain diffusion (or drain node) of each transistor includes diffusion elements on opposite sides of two gate fingers at contacts of a corresponding collection node.

The embodiment shown in FIGS. 1–2 illustrates advantages of the present invention.

First, because each pass transistor has a unique source diffusion (e.g., transistor 148 with input to in0), there is no requirement that different multiplexers share common inputs. Each multiplexer may have a distinct set of inputs.

Second, because all transistors are constructed using shared diffusions, capacitance is minimized and the multiplexer is fast and area efficient. The height of each diffusion may be halved compared to conventional devices with separated diffusions while still implementing the same total width for each pass transistor.

Third, because of the interdigitated gate structure, the pitch of the transistors (i.e., the spacing between adjacent gates) is doubled and will be similar to the width of a C-RAM cell. This increases layout efficiency and decreases area wastage due to connections between the C-RAM and pass transistor gates. As a result the invention is both faster and smaller than conventional multiplexers with separated diffusions. More generally, the present invention enables a design where the pitch of the transistors is comparable to some linear dimension (e.g., length, width or height) of the C-RAM cell.

Figure 3:
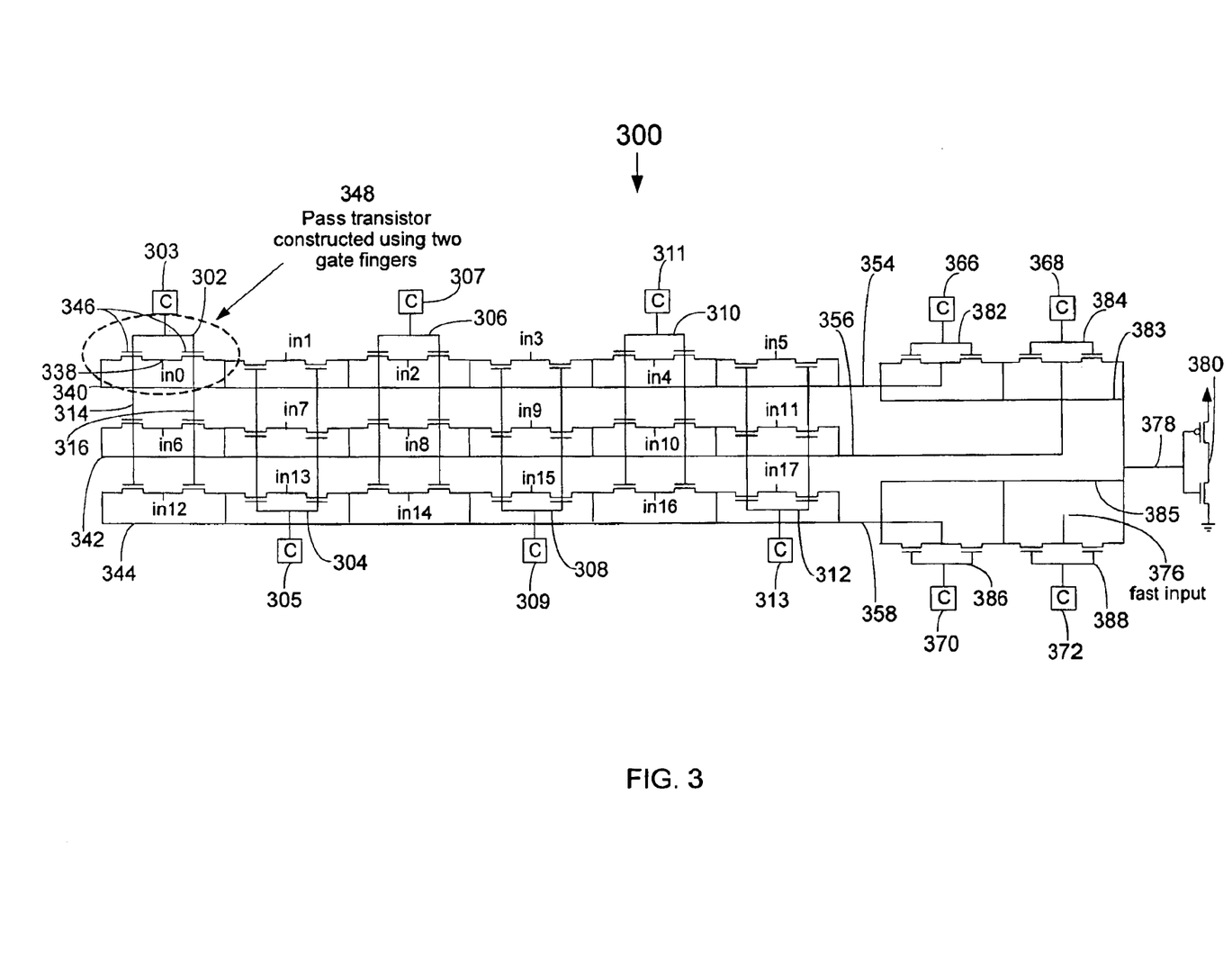
FIG. 3 shows a schematic layout of an 18-to-1 multiplexer according to another embodiment of the present invention.

FIG. 3 shows a schematic layout of an 18-to-1 multiplexer structure 300 according to an embodiment of the present invention where both the first stage and the second stage include interdigitated transistor gates and shared diffusion regions. Similarly as in the multiplexer 100 of FIG. 1, the first stage includes six gates 302, 304, 306, 308, 310, 312 with an interdigitated structure. The first gate 302 has a first finger 314 and a second finger 316, and the other gates 304, 306, 308, 310, 312, similarly have first fingers and second fingers.

The gates 302, 304, 306, 308, 310, 312 are controlled (i.e., closed or opened) by C-RAM elements 303, 305, 307, 309, 311, 313 or other memory units. Inputs nodes 338 provide input values in0–in17 as shown. Collector nodes 340, 342, 344 provide common collectors across rows of the formed transistors so that inputs in0, in1, in2, in3, in4, and in5 are connected by transistors to the first collector node 340. Similarly inputs in6, in7, in8, in9, in10, and in11 are connected to the second collector node 342, and inputs in12, in13, in14, in15, in16, and in17 are connected to the third collector node 344. Transistor elements 346 are also shown by the conventional symbols between source and drain.

As in FIG. 1, a first pass transistor 348 uses two gate fingers 314, 316 and provides a connection gate between a first input node 338 with input in0 and the output at the first collector node 340. Pass transistors are similarly defined with other input/output combinations in FIG. 1.

Outputs 354, 356, 358 from the three collector nodes 340, 342, 344 provide a first multiplexer stage output that becomes an input to a second multiplexer stage that is similarly characterized by interdigitated gates and shared diffusion. As in the embodiment shown in FIG. 1, an additional fast input 376 is included in this stage. Four gates 382, 384, 386, 388 have interdigitated structure with first fingers and second fingers. These gates 382, 384, 386, 388 are controlled by C-RAM elements 366, 368, 370, 372. Two gates 382, 384 are connected to a first collector node 383 for the second stage, and the other two gates 386, 388 are connected to a second collector node 385 for the second stage. These collector nodes 383, 385 provide the output 378 of the second stage. Additionally this multiplexer structure 300 includes a buffer and optional level restorer 380 that is connected to the output 378 of the second stage.

As in the embodiment shown in FIG. 1, this 18-to-1 multiplexer structure 300 includes a first stage with three 6-to-1 outputs (e.g., inputs in0, in1, in2, in3, in4, and in5 connected to the first output 354). A second stage includes a 3-to-1 output 378, which is illustrated with a fourth input 376. This structure 300 desirably enables diffusion sharing in its implementation for both the first stage and the second stage. Each collector node 340, 342, 344 can be implemented as a shared diffusion region, and the interdigitated structure of the gates 302, 304, 306, 308, 310, 312 enables shared diffusion regions for transistors connected by one of the collector nodes 340, 342, 344. Similarly, in the second stage shared diffusion regions are enabled for two gates 382, 384 connected to the first collector node 383 and for two gates 386, 388 connected to the second collector node 385.

Figure 4:
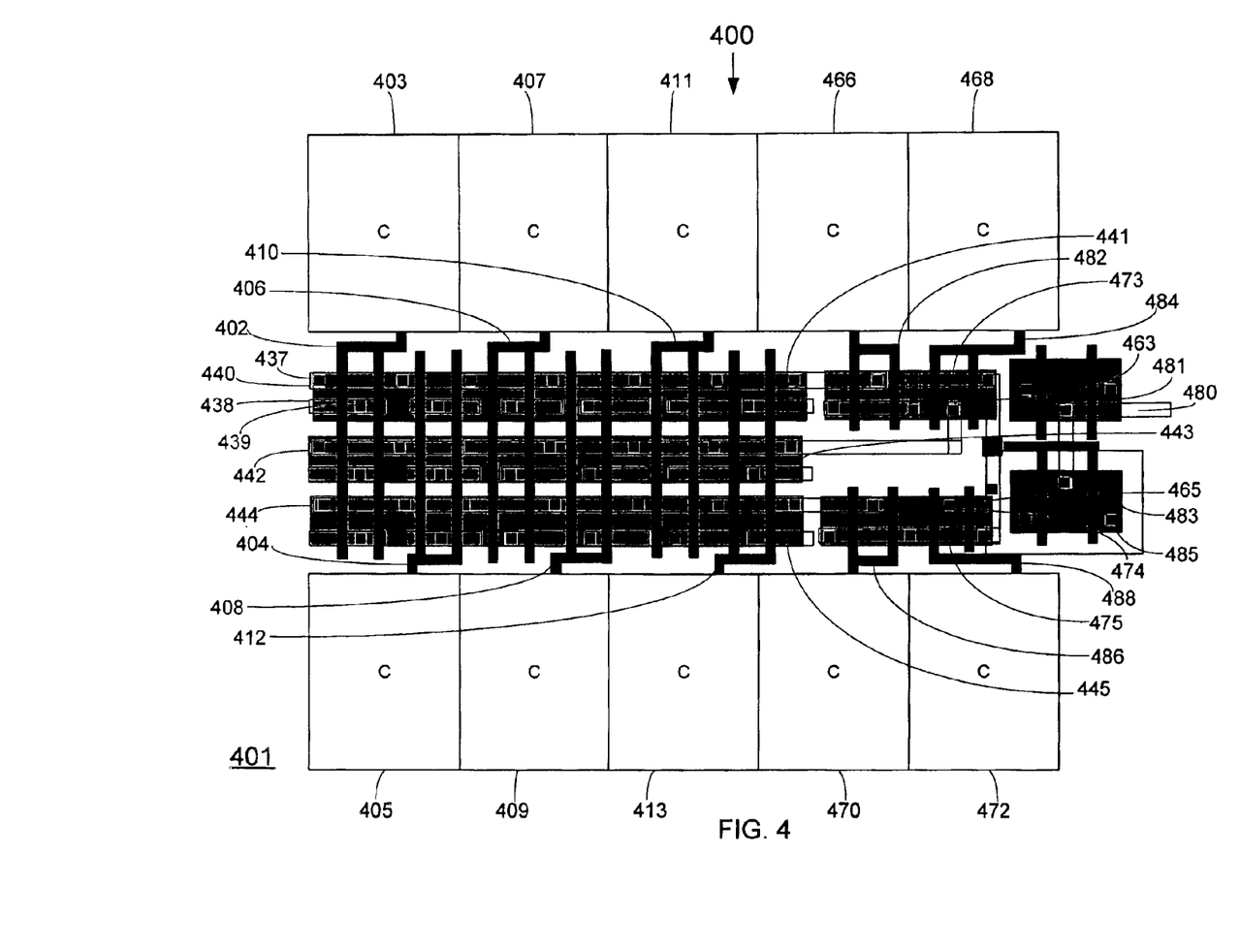
FIG. 4 shows an embodiment of hardware layout applicable to the embodiment shown in FIG. 3.

FIG. 4 shows a hardware layout corresponding to the schematic of FIG. 3. An 18-to-1 multiplexer structure 400 is disposed on a substrate 401. A first-stage multiplexer structure includes gates 402, 404, 406, 408, 410, 412 with an interdigitated structure and six C-RAM memory elements 403, 405, 407, 409, 411, 413 for controlling the gates. Input nodes 438 are shown with input node contacts 439. Collector nodes 440, 442, 444 are shown with collector node contacts 437. Corresponding to each collector node 440, 442, 444, shared diffusion regions 441, 443, 445 in the substrate 401 encompass collector nodes and associated input nodes.

The second stage of the multiplexer includes three C-RAM elements 466, 468, 470 and interdigitated gates 482, 484, 486 corresponding to the three collector nodes 440, 442, 444 plus an additional C-RAM element 472 and interdigitated gate 488 for a fast input 474. Associated common diffusion regions 463, 465 are shown. That is, a first diffusion region 463 encompasses two of the interdigitated gates 482, 484 and a first collector node 473, and a second diffusion region 465 encompasses the other two interdigitated gates 486, 488 and a second collector node 475.

Additionally as in FIG. 3, hardware elements 480 and corresponding diffusion regions 481, 483 and contacts 485 are shown in correspondence to the buffer and optional level restorer 380.

As shown in FIG. 4, the interdigitated structure of the gates 402, 404, 406, 408, 410, 412 enables shared diffusion regions 441, 443, 445 for transistors corresponding to each collector node 440, 442, 444 in the first stage structure of the multiplexer 400. Similarly the interdigitated structure of the gates 482, 484, 486, 488 enables shared diffusion regions 463, 465 for transistors corresponding to each collector node 473, 475 in the second stage of the multiplexer 400. As compared with the embodiment shown in FIG. 2, this embodiment has further advantages due to its reduced diffusion capacitance. However, the available choices for transistor sizes may create difficulties for its implementation.

Figure 5:
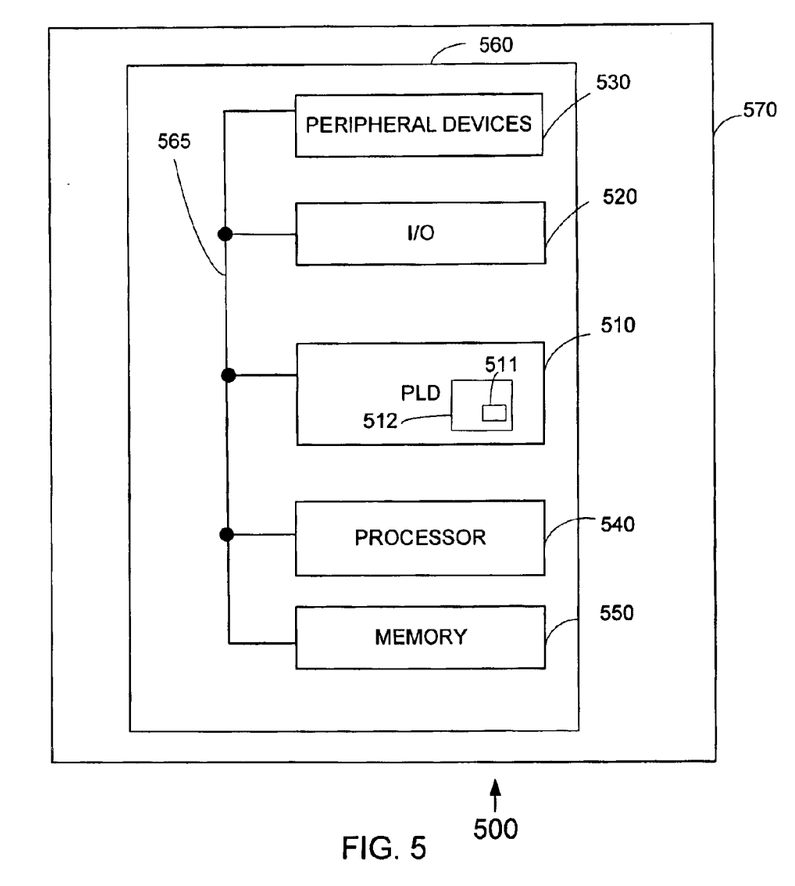
FIG. 5 shows an exemplary data processing system including an exemplary programmable logic device in which logic circuits in accordance with the present invention might be implemented.

The embodiments shown above are applicable generally to data processing environments. For example, FIG. 5 shows a data processing system 500 with a PLD 510 that may include embodiments of the present invention as discussed above. The PLD 510 includes a plurality of logic array blocks (LABs) such as the illustrated LAB 512. (Only one LAB is shown to avoid overcomplicating the drawing.) The LAB 512 includes a plurality of logic elements such as the illustrated logic element 511. (Only one logic element is shown to avoid overcomplicating the drawing.) The data processing system 500 may include one or more of the following components: a processor 540; memory 550; I/O circuitry 520; and peripheral devices 530. These components are coupled together by a system bus 565 and are populated on a circuit board 560 which is contained in an end-user system 570.

The system 500 can be used in a wide variety of applications, such as computer networking, data networking, instrumentation, video processing, digital signal processing, or any other application where the advantage of using programmable or reprogrammable logic is desirable. The PLD 510 can be used to perform a variety of different logic functions. For example, the PLD 510 can be configured as a processor or controller that works in cooperation with processor 540 (or, in alternative embodiments, a PLD might itself act as the sole system processor). The PLD 510 may also be used as an arbiter for arbitrating access to shared resources in the system 500. In yet another example, the PLD 510 can be configured as an interface between the processor 540 and one of the other components in system 500. It should be noted that system 500 is only exemplary.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

what is claimed is:

1. A multiplexer structure comprising:
   a semiconductor substrate having a shared diffusion region;
   a contact for a first input node disposed on the shared diffusion region;
   a contact for a second input node disposed on the shared diffusion region;
   first, second and third contacts for a collector node disposed on the shared diffusion region;
   a first gate disposed on the shared diffusion region, the first gate having a first finger disposed between the contact for the first input node and the first contact for the collector node and a second finger disposed between the contact for the first input node and the second contact for the collector node; and
   a second gate disposed on the shared diffusion region, the second gate having a first finger disposed between the contact for the second input node and the second contact for the collector node and a second finger disposed between the contact for the second input node and the third contact for the collector node, wherein
   closing the first gate electrically connects the first input node and the collector node, and
   closing the second gate electrically connects the second input node and the collector node.

2. A multiplexer structure according to claim 1, wherein the first gate, the first input node and the collector node define a first transistor element, and
   the second gate, second input node and the collector node define a second transistor element.

3. A multiplexer structure according to claim 1, further comprising:
   a first memory element connected to the first gate for closing the first gate; and a second memory element connected to the second gate for closing the second gate.

4. A multiplexer structure according to claim 3, wherein a spacing between the first gate and the second gate is comparable to a linear dimension of the first memory element.

5. A multiplexer structure according to claim 1, further comprising:
   a first input element connected to the first input node for providing input values to the first input node; and
   a second input element connected to the second input node for providing input values to the second input node.

6. A programmable logic device, comprising: a multiplexer structure according to claim 1.

7. A data processing system, comprising: a programmable logic device according to claim 6.

8. A multiplexer structure comprising:
   a semiconductor substrate having a plurality of shared diffusion regions;
   a plurality of contacts for input nodes disposed on the shared diffusion regions;
   a plurality of contacts for collector nodes disposed on the shared diffusion regions; and
   a plurality of gates disposed on the substrate across the shared diffusion regions, each gate having a first finger and a second finger that enclose at least one of the input node contacts, and each two adjacent gates being separated by at least one of the collector node contacts, wherein closing a first gate electrically connects corresponding input nodes enclosed by the first gate with adjacent collector nodes in the shared diffusion regions.

9. A multiplexer structure according to claim 8, wherein in each shared diffusion region a configuration of the first gate, an input node between the fingers of the first gate, and at least one collector node adjacent to the first gate defines a transistor element.

10. A multiplexer structure according to claim 8, further comprising: a plurality of memory elements connected to the gates for closing the gates.

11. A multiplexer structure according to claim 10, wherein a spacing between the gates is comparable to a linear dimension of the memory elements.

12. A multiplexer structure according to claim 8, further comprising: a plurality of input elements connected to the inputs nodes for providing input values to the input nodes.

13. A multiplexer structure according to claim 8, further comprising: a connecting element for electrically connecting the contacts of collector nodes across a first shared diffusion region so that the connecting element provides a multiplexer output from the input nodes in the first shared diffusion region.

14. A multiplexer structure according to claim 8, further comprising: a plurality of connecting elements for electrically connecting the contacts of collector nodes across the shared diffusion regions so that the connecting elements provide a multiplexer output stage from the input nodes in the shared diffusion regions.

15. A programmable logic device, comprising: a multiplexer structure according to claim 8.

16. A data processing system, comprising: a programmable logic device according to claim 15.

17. A method of providing a multiplexing structure, comprising:
   providing a semiconductor substrate having a shared diffusion region;
   disposing a contact for a first input node on the shared diffusion region;
   disposing a contact for a second input node on the shared diffusion region;
   disposing first, second and third contacts for a collector node on the shared diffusion region;
   disposing a first gate on the shared diffusion region, the first gate having a first finger disposed between the contact for the first input node and the first contact for the collector node and a second finger disposed between the contact for the first input node and the second contact for the collector node; and
   disposing a second gate on the shared diffusion region, the second gate having a first finger disposed between the contact for the second input node and the second contact for the collector node and a second finger disposed between the contact for the second input node and the third contact for the collector node, wherein closing the first gate electrically connects the first input node and the collector node, and
   closing the second gate electrically connects the second input node and the collector node.

18. A method according to claim 17, wherein
   the first gate, the first input node and the collector node define a first transistor element, and
   the second gate, second input node and the collector node define a second transistor element.

19. A method according to claim 17, further comprising:
   connecting a first memory element to the first gate for closing the first gate; and
   connecting a second memory element to the second gate for closing the second gate.

20. A method according to claim 19, wherein a spacing between the first gate and the second gate is comparable to a linear dimension of the first memory element.

21. A method according to claim 17, further comprising:
   connecting a first input element to the first input node for providing input values to the first input node; and
   connecting a second input element connected to the second input node for providing input values to the second input node.

22. A method of providing a multiplexer structure comprising:
   providing a semiconductor substrate having a plurality of shared diffusion regions;
   disposing a plurality of contacts for input nodes on the shared diffusion regions;
   disposing a plurality of contacts for collector nodes on the shared diffusion regions
   disposing a plurality of gates on the substrate across the shared diffusion regions, each gate having a first finger and a second finger that enclose at least one of the input node contacts, and each two adjacent gates being separated by at least one of the collector node contacts, wherein closing a first gate electrically connects corresponding input nodes enclosed by the first gate with adjacent collector nodes in the shared diffusion regions.

23. A method according to claim 22, wherein in each shared diffusion region a configuration of the first gate, an input node between the fingers of the first gate, and at least one collector node adjacent to the first gate defines a transistor element.

24. A method according to claim 22, further comprising: connecting a plurality of memory elements to the gates for closing the gates.

25. A method according to claim 24, wherein a spacing between the gates is comparable to a linear dimension of the memory elements.

26. A method according to claim 22, further comprising: connecting a plurality of input elements to the inputs nodes for providing input values to the input nodes.

27. A method according to claim 22, further comprising: providing a connecting element for electrically connecting the contacts of collector nodes across a first shared diffusion region so that the connecting element provides a multiplexer output from the input nodes in the first shared diffusion region.

28. A method according to claim 22, further comprising: providing a plurality of connecting elements for electrically connecting the contacts of collector nodes across the shared diffusion regions so that the connecting elements provide a multiplexer output stage from the input nodes in the shared diffusion regions.

29. A multiplexer structure comprising:
   a semiconductor substrate having a plurality of shared diffusion regions;
   a plurality of contacts for input nodes disposed on the shared diffusion regions;
   a plurality of contacts for collector nodes disposed on the shared diffusion regions; and
   a gate disposed on the substrate across the shared diffusion regions, the gate having a first finger and a second finger that enclose the input node contacts, wherein closing the gate electrically connects corresponding input nodes and collector nodes in the shared diffusion regions.

30. A multiplexer structure according to claim 29, wherein in each shared diffusion region a configuration of the gate, an input node between the fingers of the gate, and at least one collector node adjacent to the gate defines a transistor element.

31. A multiplexer structure according to claim 29, further comprising: a memory element connected to the gate for closing the gate.

32. A multiplexer structure according to claim 29, further comprising: a plurality of input elements connected to the inputs nodes for providing input values to the input nodes.

33. A programmable logic device, comprising: a multiplexer structure according to claim 29.

34. A data processing system, comprising: a programmable logic device according to claim 33.

35. A method of providing a multiplexer structure comprising:
   providing a semiconductor substrate having a plurality of shared diffusion regions;
   disposing a plurality of contacts for input nodes on the shared diffusion regions;
   disposing a plurality of contacts for collector nodes on the shared diffusion regions;
   disposing a gate disposed on the substrate across the shared diffusion regions, the gate having a first finger and a second finger that enclose the input node contacts, wherein closing the gate electrically connects corresponding input nodes and collector nodes in the shared diffusion regions.

36. A method according to claim 35, wherein in each shared diffusion region a configuration of the gate, an input node between the fingers of the gate, and at least one collector node adjacent to the gate defines a transistor element.

37. A method according to claim 35, further comprising: connecting a memory element to the gate for closing the gate.

38. A method according to claim 35, further comprising: connecting a plurality of input elements to the inputs nodes for providing input values to the input nodes.

* * * * *